(12) United States Patent
Chen

(10) Patent No.: US 7,804,083 B2
(45) Date of Patent: Sep. 28, 2010

(54) PHASE CHANGE MEMORY CELL INCLUDING A THERMAL PROTECT BOTTOM ELECTRODE AND MANUFACTURING METHODS

(75) Inventor: Shih-Hung Chen, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 21 days.

(21) Appl. No.: 11/940,164

(22) Filed: Nov. 14, 2007

(65) Prior Publication Data
US 2009/0122588 A1 May 14, 2009

(51) Int. Cl.
*H01L 47/00* (2006.01)
*H01L 29/04* (2006.01)
*H01L 31/036* (2006.01)

(52) U.S. Cl. ............ 257/3; 257/4; 257/74; 257/E29.002

(58) Field of Classification Search ............ 257/3, 257/4, E45.002, 74; 365/52; 216/41; 427/58
See application file for complete search history.

(56) References Cited

U.S. PATENT DOCUMENTS

| | | | |
|---|---|---|---|
| 3,271,591 | A | 9/1966 | Ovshinsky |
| 3,530,441 | A | 9/1970 | Ovshinsky |
| 4,599,705 | A | 7/1986 | Holmberg et al. |
| 4,719,594 | A | 1/1988 | Young et al. |
| 4,876,220 | A | 10/1989 | Mohsen et al. |
| 4,959,812 | A | 9/1990 | Momodomi et al. |
| 5,166,096 | A | 11/1992 | Cote et al. |
| 5,166,758 | A | 11/1992 | Ovshinsky et al. |
| 5,177,567 | A | 1/1993 | Klersy et al. |
| 5,515,488 | A | 5/1996 | Hoppe et al. |
| 5,534,712 | A | 7/1996 | Ovshinsky et al. |
| 5,687,112 | A | 11/1997 | Ovshinsky |
| 5,789,277 | A | 8/1998 | Zahorik et al. |
| 5,789,758 | A | 8/1998 | Reinberg |
| 5,814,527 | A | 9/1998 | Wolstenholme et al. |
| 5,831,276 | A | 11/1998 | Gonzalez et al. |
| 5,837,564 | A | 11/1998 | Sandhu et al. |

(Continued)

FOREIGN PATENT DOCUMENTS

| | | |
|---|---|---|
| CN | 1967896 A | 5/2007 |
| WO | WO-00/79539 | 12/2000 |
| WO | WO-01/45108 | 6/2001 |

OTHER PUBLICATIONS

Li, Yiming, et al, Temperature dependence on the contact size of GeSbTe films for phase change memories, Journal of Computational Electronics, vol. 7, No. 3, Sep. 2008, pp. 138-141.*

(Continued)

*Primary Examiner*—David S Blum
(74) *Attorney, Agent, or Firm*—Kenta Suzue; Haynes Beffel & Wolfeld LLP

(57) ABSTRACT

Memory devices are described along with manufacturing methods. An embodiment of a memory device as described herein includes a bottom electrode, a thermal protect structure on the bottom electrode, and a multi-layer stack on the thermal protect structure. The thermal protect structure comprises a layer of thermal protect material, the thermal protect material having a thermal conductivity less than that of the bottom electrode material.

12 Claims, 17 Drawing Sheets

U.S. PATENT DOCUMENTS

| | | | |
|---|---|---|---|
| 5,869,843 A | 2/1999 | Harshfield | |
| 5,879,955 A | 3/1999 | Gonzalez et al. | |
| 5,920,788 A | 7/1999 | Reinberg | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan et al. | |
| 6,025,220 A | 2/2000 | Sandhu | |
| 6,031,287 A | 2/2000 | Harshfield | |
| 6,034,882 A | 3/2000 | Johnson et al. | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,314,014 B1 | 11/2001 | Lowrey et al. | |
| 6,320,786 B1 | 11/2001 | Chang et al. | |
| 6,339,544 B1 | 1/2002 | Chiang et al. | |
| 6,351,406 B1 | 2/2002 | Johnson et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,534,781 B2 | 3/2003 | Dennison | |
| 6,545,903 B1 | 4/2003 | Wu | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,579,760 B1 | 6/2003 | Lung et al. | |
| 6,586,761 B2 | 7/2003 | Lowrey | |
| 6,589,714 B2 | 7/2003 | Maimon et al. | |
| 6,593,176 B2 | 7/2003 | Dennison | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,744,088 B1 | 6/2004 | Dennison | |
| 6,791,102 B2 | 9/2004 | Johnson et al. | |
| 6,797,979 B2 | 9/2004 | Chiang et al. | |
| 6,800,504 B2 | 10/2004 | Li et al. | |
| 6,800,563 B2 | 10/2004 | Xu | |
| 6,805,563 B2 | 10/2004 | Ohashi et al. | |
| 6,815,704 B1 | 11/2004 | Chen | |
| 6,830,952 B2 | 12/2004 | Lung et al. | |
| 6,850,432 B2 | 2/2005 | Lu et al. | |
| 6,859,389 B2 | 2/2005 | Idehara et al. | |
| 6,861,267 B2 | 3/2005 | Xu et al. | |
| 6,864,500 B2 | 3/2005 | Gilton | |
| 6,864,503 B2 | 3/2005 | Lung et al. | |
| 6,867,638 B2 | 3/2005 | Saiki et al. | |
| 6,888,750 B2 | 5/2005 | Walker et al. | |
| 6,894,305 B2 | 5/2005 | Yi et al. | |
| 6,903,362 B2 | 6/2005 | Wyeth et al. | |
| 6,909,107 B2 | 6/2005 | Rodgers et al. | |
| 6,927,410 B2 | 8/2005 | Chen | |
| 6,933,516 B2 | 8/2005 | Xu | |
| 6,936,840 B2 | 8/2005 | Sun et al. | |
| 6,937,507 B2 | 8/2005 | Chen | |
| 6,992,932 B2 | 1/2006 | Cohen et al. | |
| 7,023,009 B2 | 4/2006 | Kostylev et al. | |
| 7,033,856 B2 | 4/2006 | Lung et al. | |
| 7,042,001 B2 | 5/2006 | Kim et al. | |
| 7,067,865 B2 | 6/2006 | Lung et al. | |
| 7,132,675 B2 * | 11/2006 | Gilton | 257/3 |
| 7,166,533 B2 | 1/2007 | Happ | |
| 7,214,958 B2 | 5/2007 | Happ | |
| 7,220,983 B2 | 5/2007 | Lung | |
| 7,471,555 B2 | 12/2008 | Lung | |
| 2002/0017701 A1 * | 2/2002 | Klersy et al. | 257/536 |
| 2005/0029502 A1 | 2/2005 | Hudgens | |
| 2005/0093022 A1 | 5/2005 | Lung | |
| 2005/0201182 A1 | 9/2005 | Osada et al. | |
| 2005/0212024 A1 | 9/2005 | Happ | |
| 2005/0215009 A1 | 9/2005 | Cho | |
| 2006/0018156 A1 * | 1/2006 | Happ | 365/185.05 |
| 2006/0108667 A1 | 5/2006 | Lung | |
| 2006/0110878 A1 | 5/2006 | Lung et al. | |
| 2006/0118913 A1 | 6/2006 | Yi et al. | |
| 2006/0175599 A1 | 8/2006 | Happ | |
| 2006/0234138 A1 | 10/2006 | Fehlhaber et al. | |
| 2006/0284157 A1 | 12/2006 | Chen et al. | |
| 2006/0284158 A1 | 12/2006 | Lung et al. | |
| 2006/0284214 A1 | 12/2006 | Chen | |
| 2006/0284279 A1 | 12/2006 | Lung et al. | |
| 2006/0286709 A1 | 12/2006 | Lung et al. | |
| 2006/0286743 A1 | 12/2006 | Lung et al. | |
| 2007/0030721 A1 | 2/2007 | Segal et al. | |
| 2007/0037101 A1 | 2/2007 | Morioka | |
| 2007/0108077 A1 | 5/2007 | Lung et al. | |
| 2007/0108429 A1 | 5/2007 | Lung | |
| 2007/0108430 A1 * | 5/2007 | Lung | 257/4 |
| 2007/0108431 A1 | 5/2007 | Chen et al. | |
| 2007/0109836 A1 | 5/2007 | Lung | |
| 2007/0109843 A1 | 5/2007 | Lung et al. | |
| 2007/0111429 A1 | 5/2007 | Lung | |
| 2007/0115794 A1 | 5/2007 | Lung | |
| 2007/0117315 A1 | 5/2007 | Lai et al. | |
| 2007/0121363 A1 | 5/2007 | Lung | |
| 2007/0121374 A1 | 5/2007 | Lung et al. | |
| 2007/0126040 A1 | 6/2007 | Lung | |
| 2007/0131922 A1 | 6/2007 | Lung | |
| 2007/0131980 A1 | 6/2007 | Lung | |
| 2007/0138458 A1 | 6/2007 | Lung | |
| 2007/0147105 A1 | 6/2007 | Lung et al. | |
| 2007/0154847 A1 | 7/2007 | Chen et al. | |
| 2007/0155172 A1 | 7/2007 | Lai et al. | |
| 2007/0158632 A1 | 7/2007 | Ho | |
| 2007/0158633 A1 | 7/2007 | Lai et al. | |
| 2007/0158645 A1 | 7/2007 | Lung | |
| 2007/0158690 A1 | 7/2007 | Ho et al. | |
| 2007/0158862 A1 | 7/2007 | Lung | |
| 2007/0161186 A1 | 7/2007 | Ho | |
| 2007/0173019 A1 | 7/2007 | Ho et al. | |

| | | | |
|---|---|---|---|
| 2007/0173063 A1 | 7/2007 | Lung | |
| 2007/0176261 A1 | 8/2007 | Lung | |

OTHER PUBLICATIONS

Adler, David, "Amorphous-Semiconductor Devices," Sci. Amer., vol. 236, pp. 36-48, May 1977.

Adler, D. et al., "Threshold Switching in Chalgenid-Glass Thin Films," J. Appl/Phys 51(6), Jun. 1980, pp. 3289-3309.

Ahn, S.J. et al., "A Highly Manufacturable High Density Phase Change Memory og 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory, " AFIT/GE/ENG/00M-04, Mar. 2000 121 pages.

Chen, et al., "Non-Volatile Resistive Switching for Advanced Memory Applications," IEEE IEDM, Dec. 5-7, 2005, 4 pp.

Cho, S.L. et al., "Highly Scalable On-axis Confined Cell Structure for High Density PRAM beyond 256Mb," 2005 Symposium on VLSI Technology Digest of Technical Papers, pp. 96-97.

Gibson, G.A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y.H. et al., "An Edge Contact Type Cell from Phase Change RAM Featuring Very Low Power Consumtion," 2003 Symposium on VSLI Technology Digest of Technical Papers, pp. 175-176.

Happ, T.D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-Change RAM Based on 0.24μm-CMOS Technologies," 2003 Symposium on VLSI Technology Digest of Technical Papers, pp. 173-174.

Iwasaki, Hiroko et al, "completely Erasable Phase Change Optical Disk," Jpn. J. Appl. Phys., Feb. 1992, pp. 461-465, vol. 31.

Jeong, C.W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43$^{rd}$ Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org <http://www.sciencenews.org22 , Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search=nonvolatile%-20 high%20density%20high%20performance%20phase%20change%20memory <http://klabs.org/richcontent/MAPLDCon99/Papers/P21_Tyson_P.PDF#search='nonvolatile%20high%20density%20 high%20performance%20phase%20change%20memory>', 8 pages.

Wolf, Stanley, Excerpt from: Silicon Processing for the VLSI Era-vol. 4, pp. 674-679, 2004.

Wicker, Guy, "A Comprehensive Model of Submicron Chalcogenide Switching Devices," Doctoral Dissertation, Wayne State University, Detroit, MI, 1996.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Ahn, S. J. et al., "Highly Reliable 5nm Contact Cell Technology for 256Mb PRAM," VLSI Technology, Digest of Technical Papers, Jun. 14-16, 2005, pp. 98-99.

Chao, D-S. et al., "Low Programming Current Phase Change Memory Cell with Double gst Thermally Confined Structure," VLSI-TSA 2007, International symposium Apr. 23-25, 2007, 2pp.

"Thermal Conductivity of Crystalline Dielectrics" in CRC Handbook of Chemistry and Physics, Internet Version 2007, (87th edition), David R. Lide, ed. Taylor and Francis, Boca Raton, FL.

Schafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.

* cited by examiner

US 7,804,083 B2

PHASE CHANGE MEMORY CELL INCLUDING A THERMAL PROTECT BOTTOM ELECTRODE AND MANUFACTURING METHODS

BACKGROUND OF THE INVENTION

1. Field of the Invention

The present invention relates to high density memory devices based on phase change based memory materials, including chalcogenide based materials and on other programmable resistive materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or break down the crystalline structure, after which the phase change material cools quickly, quenching the phase change process, allowing at least a portion of the phase change structure to stabilize in the amorphous state. It is desirable to minimize the magnitude of the reset current used to cause transition of phase change material from the crystalline state to the amorphous state. The magnitude of the reset current needed for reset can be reduced by reducing the size of the phase change material element in the cell and of the contact area between electrodes and the phase change material, so that higher current densities are achieved with small absolute current values through the phase change material element.

A specific issue arising from conventional phase change memory and structures is the heat sink effect of conventional designs. FIG. 1 illustrates a cross-sectional view of a prior art memory cell having a bottom electrode 110 in a dielectric layer 100, a phase change kernel 120 on the bottom electrode 110, and a top electrode 130 on the phase change kernel 120. The conductive bottom electrode 110 acts as a heat sink, the high heat conductivity of the bottom electrode 110 rapidly drawing heat away from the phase change kernel 120. Because the phase change process of the kernel 120 occurs as a result of heating, the heat sink effect results in a requirement for higher current in order to effect the desired phase change.

FIG. 2 illustrates a cross-sectional view of a memory cell with a structure similar to that of FIG. 1, further including a seam 140 in the bottom electrode 110. As is known the art, deposition into a relatively high-aspect ratio opening, such as forming the bottom electrode 110 in an opening in dielectric layer 100, can result in the formation of seams 140 in the deposited material. Deposited material tends to cling to the sides of a receptacle structure, leaving voids or seams instead of a uniformly solid material. Because of its high conformity, tungsten is particularly susceptible to that phenomenon. A subsequent etching or Chemical Mechanical Polishing CMP step can open the seam, but nevertheless a seam can remain in the deposited structure. In such an instance, the subsequently deposited phase change kernel 120 may not make full contact with the bottom electrode 110, resulting in a poor contact and issues with memory cell stability and reliability.

Problems have arisen in manufacturing such devices with very small dimensions, and with variations in processes that meet the tight specifications needed for large-scale memory devices. It is desirable therefore to provide a memory cell structure having small dimensions and low reset currents, as well as a structure that addresses the heat conductivity problem, and methods for manufacturing such structure that meets tight process variation specifications needed for large-scale memory devices. Furthermore, it is desirable to produce memory devices having a small active phase change region.

SUMMARY OF THE INVENTION

A memory device as described herein includes a bottom electrode, a thermal protect structure on the bottom electrode, and a multi-layer stack on the thermal protect structure. The thermal protect structure comprises a layer of thermal protect material, the thermal protect material having a thermal conductivity less than that of the bottom electrode material. The multi-layer stack comprises a top electrode on a phase change kernel. The multi-layer stack has a first width in a first direction less than that of the layer of thermal protect material and a second width in a second direction less than that of the layer of thermal protect material, the second direction perpendicular to the first direction.

A method for manufacturing a memory device as described herein includes providing a bottom electrode extending to a top surface of a first dielectric layer. Sequentially a layer of first barrier material, a layer of thermal protect material, a layer of second barrier material, a layer of phase change material, a layer of top electrode material, and a layer of hard mask material are formed over the first bottom electrode such that the layer of first barrier material is on the bottom electrode. A pillar of photoresist overlying the bottom electrode is formed on the hard mask material. Etching down through the layer of phase change material is performed using the pillar as a mask to form a multi-layer stack. The multi-layer stack comprises (a) a phase change kernel comprising phase change material, the phase change kernel having a sidewall, (b) a top electrode comprising top electrode material on the phase change kernel, and (c) a hard mask cap comprising hard mask material on the top electrode. A layer of a second dielectric material is then formed on the multi-layer stack and etching is performed on the second dielectric material to form a dielectric spacer on the sidewall of the phase change kernel. Etching is then performed down to the first dielectric layer using the dielectric spacer and the hard mask cap as a mask to form a thermal protect structure. The thermal protect structure comprises (a) a first barrier layer comprising first barrier material on the bottom electrode, (b) a thermal protect layer comprising thermal protect material on the barrier layer, and (c) a second barrier layer comprising second barrier material on the thermal protect layer. The thermal protect material has a thermal conductivity less than that of the bottom electrode material and has an electrical conductivity less than that of the first and second barrier layer materials, and the memory material has at least two solid phases.

Another method for manufacturing a memory device as described herein includes providing a bottom electrode extending to a top surface of a first dielectric layer and etching a portion of the bottom electrode to form a recess. A conformal layer of a first barrier material if formed on the top surface of the first dielectric layer and within the recess to contact the bottom electrode to define an opening within the recess. A layer of thermal protect material is formed to fill the opening within the recess. The layer of first barrier material and the layer of thermal protect material are planarized to expose the top surface of the first dielectric layer, thereby forming a first barrier layer comprising first barrier material on the bottom electrode and within the recess, and forming a thermal protect layer comprising thermal protect material on the first barrier layer and within the recess. Sequentially a layer of second barrier material, a layer of phase change material, and a layer of top electrode material are formed over the first dielectric layer, such that the layer of second barrier material is on the thermal protect layer. A pillar of photoresist if formed on the layer of top electrode material and overlying the bottom electrode. Etching is performed down through the layer of phase change material using the pillar as a mask to form a multi-layer stack. The multi-layer stack comprises a phase change kernel comprising phase change material and a top electrode comprising top electrode material on the phase change kernel, the phase change kernel having a sidewall. A layer of second dielectric material is formed on the multi-layer stack and etching is performed on the layer of dielectric material and the layer of second barrier material. The etching forming a second barrier layer comprising second barrier material on the thermal protect layer, and forming a dielectric spacer comprising second dielectric material on the sidewall of the phase change kernel.

In memory cells described herein the active region can be made extremely small, reducing the magnitude of current needed to induce phase changes. In preferred embodiments the width (which in some embodiments is a diameter) of the phase change kernel is less than a minimum feature size for a lithographic process used to form the memory cell. The thickness of the kernel can also be less than the minimum feature size for a lithographic process used to form the memory cell, and the thickness can be established by a thin film deposition technique of memory material on the thermal protect structure.

The thermal protect structure acts as a heat insulator to reduce the amount of heat drawn away from the phase change kernel by the bottom electrode, effectively increasing the amount of heat generated within the phase change kernel per unit value of current. The thermal isolation of the kernel allows for memory cell designs having lower currents than those permitted by the prior art.

Other aspects and advantages of the invention are described below with reference to the figures.

DETAILED DESCRIPTION

Figure 1:
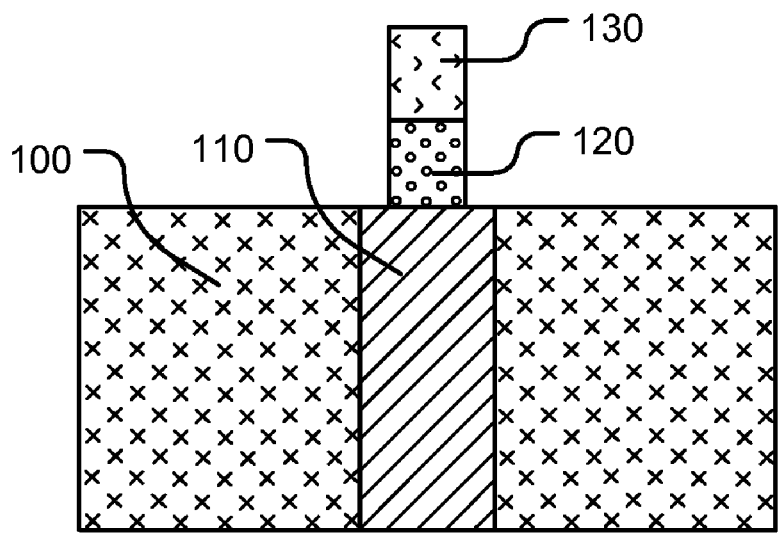
FIG. 1 illustrates a cross-sectional view of a prior art phase change memory cell.
Figure 2:
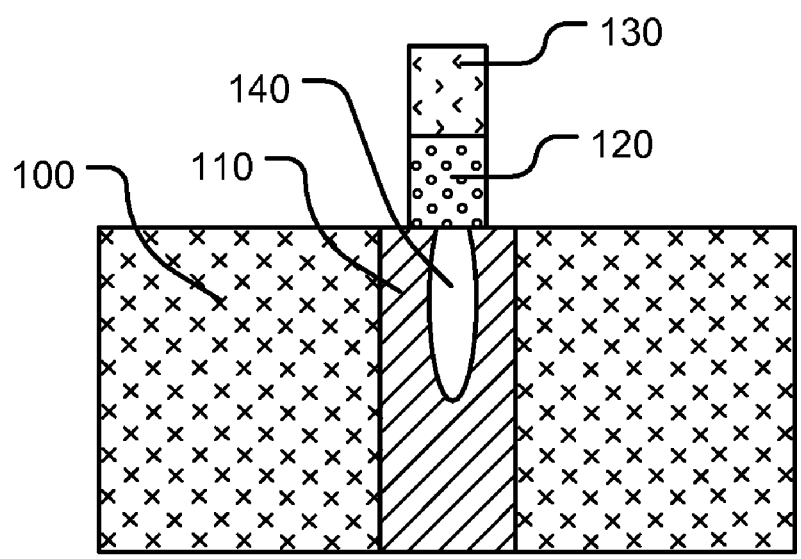
FIG. 2 illustrates a cross-sectional view of a prior art phase change memory cell having a seam in the bottom electrode.

The following description of the invention will typically be with reference to specific structural embodiments and methods. It is understood that there is no intention to limit the invention to the specifically disclosed embodiments and methods but that the invention may be practiced using other features, elements, methods, and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

With regard to directional descriptions herein, the orientation of the drawings establish their respective frames of reference, with "up", "down", "left" and "right" referring to directions shown on the respective drawings. Similarly, "thickness" refers to a vertical dimension and "width" to the horizontal. These directions have no application to orientation of the circuits in operation or otherwise, as will be understood by those in the art.

A detailed description is provided with reference to FIGS. 3-20.

Figure 3A:
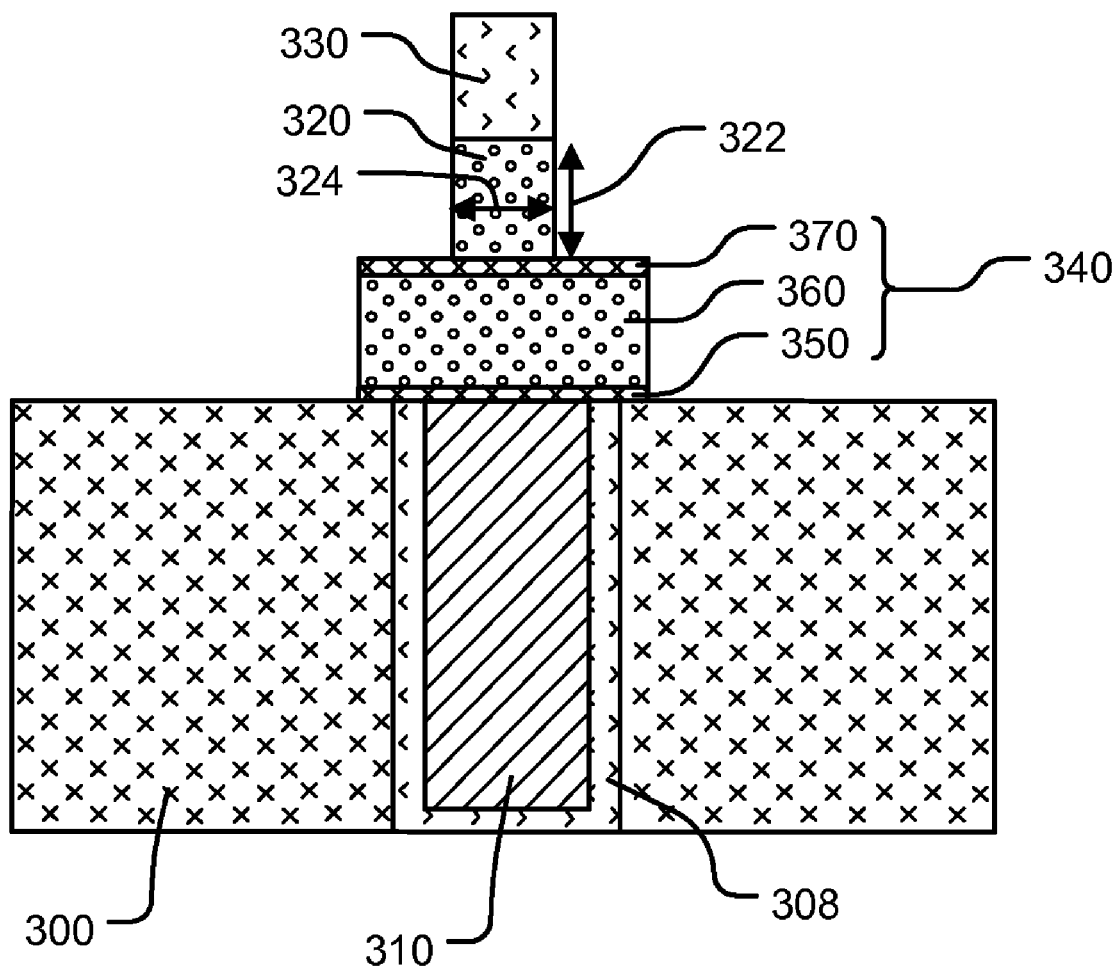
FIG. 3A illustrates a cross-sectional view of a memory cell having a thermal protect structure in accordance with an embodiment.

FIG. 3A illustrates a cross-sectional view of a memory cell having a thermal protect structure 340 between a top electrode 330 and a bottom electrode 310 in accordance with an embodiment.

The bottom electrode 310 extends through an inter-layer dielectric 300 to underlying access circuitry (not shown). The inter-layer dielectric 300 preferably consists of silicon dioxide or a well-known alternative thereto, such as a polymide, silicon nitride or other dielectric fill material. In embodiments, the dielectric 300 comprises a relatively good insulator for heat as well as for electricity, providing thermal and electrical isolation. The bottom electrode 310 preferably comprises a refractory metal such as tungsten. Other metals that may be used for the bottom electrode 310 include Ti, Mo, Al, Ta, Cu, Pt, Ir, La, Ni, N, O and Ru. Other bottom electrode structures and materials can be used as well. An optional layer 308 separates the bottom electrode 310 from the dielectric layer 300 and the underlying access circuitry (not shown). The layer 308 can provide a diffusion barrier between the bottom electrode 310 and the dielectric layer 300 depending upon the materials chosen.

Figure 3B:
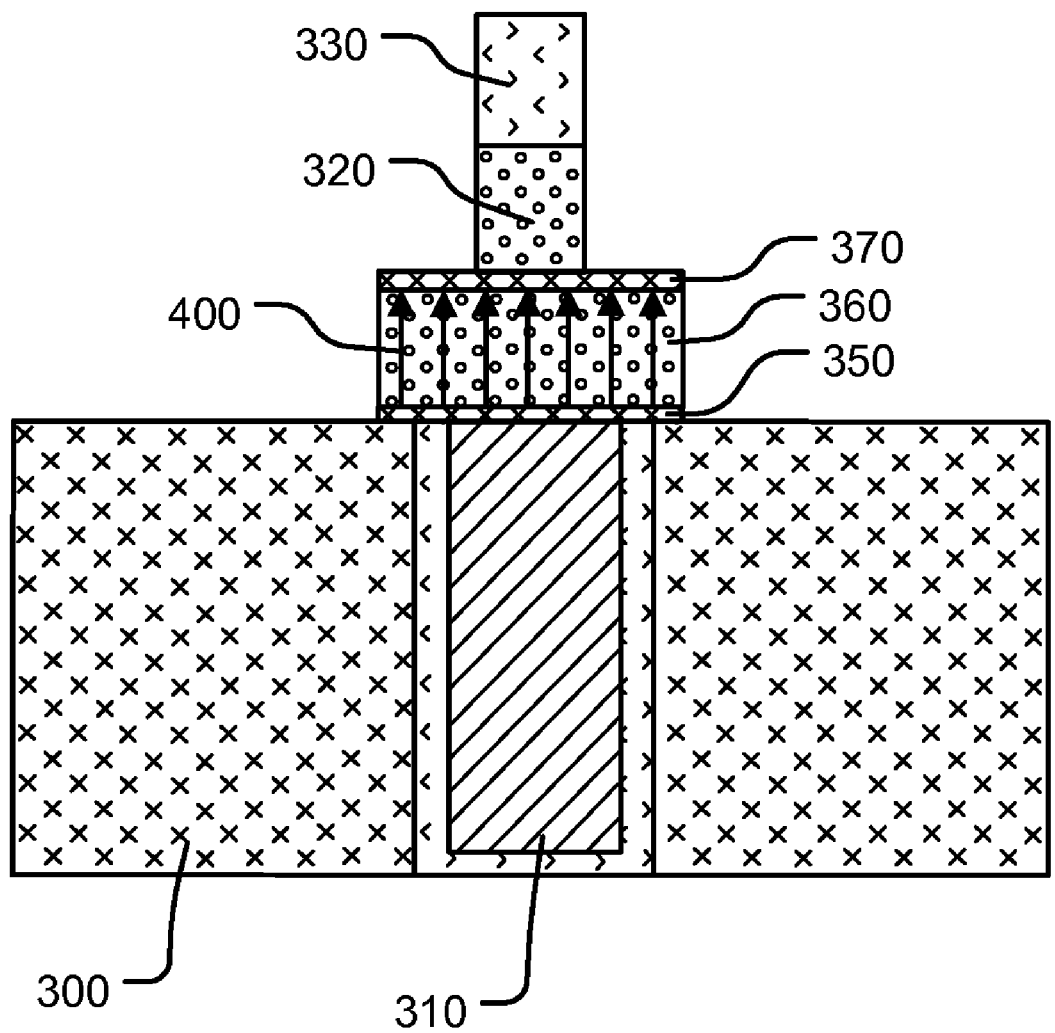
FIG. 3B illustrates a cross-sectional view of the memory cell of FIG. 3A showing how the first and second barrier layers beneficially effect the uniformity of the electric field/current density within the thermal protect layer.

In the illustrate embodiment of FIG. 3A the thermal protect structure 340 comprises a first barrier material layer 350 on the bottom electrode 310, a thermal protect material layer 360 on the first barrier layer 350, and a second barrier material layer 370 on the thermal protect layer 360. The first and second barrier layers 350, 370 generally serve to prevent diffusion. The first and second barrier layers 350, 370 comprise material having an electrical conductivity greater than that of the material of the thermal protect layer 360, and thus beneficially affect the uniformity of the electric field/current density 400 within the thermal protect layer 360 as illustrated in FIG. 3B.

Figure 3C:
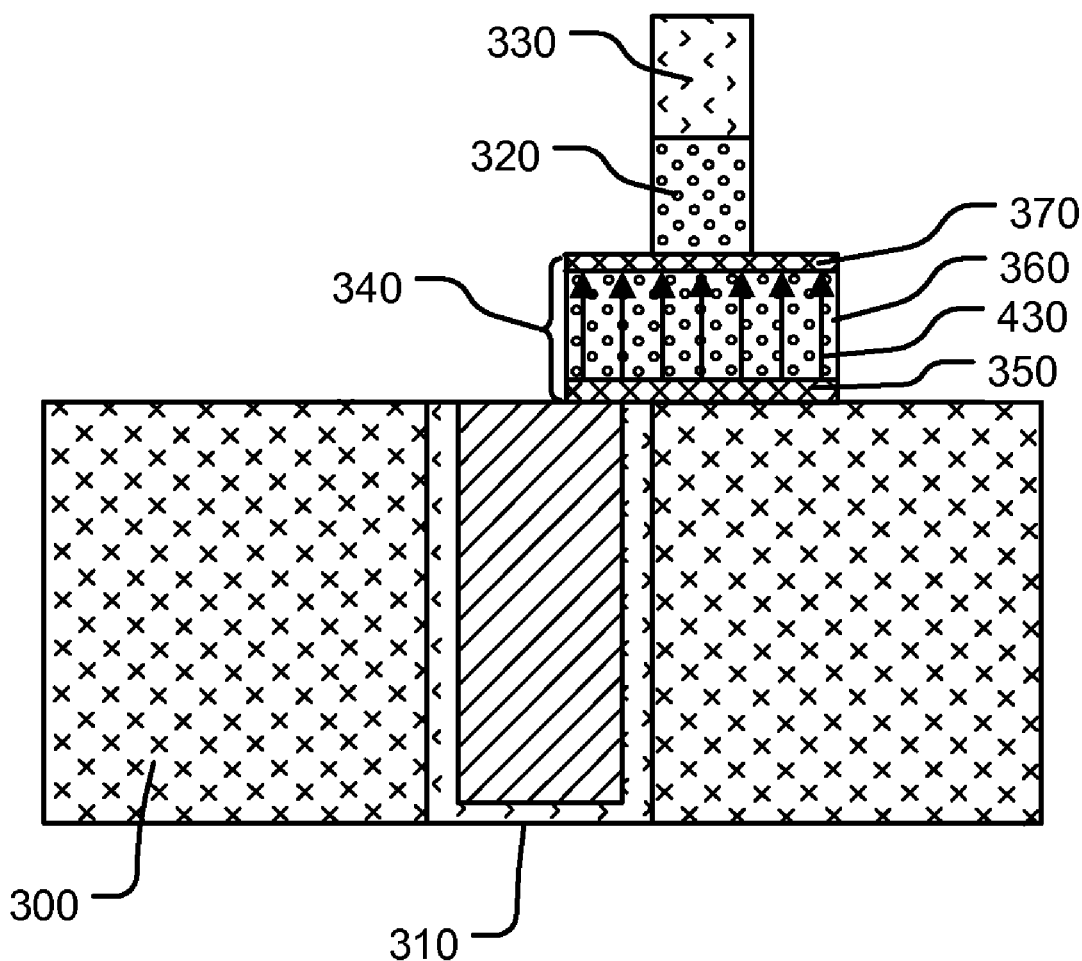
FIG. 3C illustrates a cross-sectional view of the memory cell of FIG. 3A showing how the alignment window of the thermal protect structure to the bottom electrode is large.

The beneficial effect the first and second barrier layers 350, 370 have on the uniformity of the electric field/current density 430 increases the alignment window of the thermal protect structure 340 to the bottom electrode 310 as illustrated in FIG. 3C.

The first and second barrier layers 350, 370 in some embodiments comprise the same material. Alternatively, the first and second barrier layers 350, 370 comprise different materials. The first and second barrier layers 350, 370 are preferably formed of titanium nitride (TiN) or similar material, such as one or more elements selected from the group consisting of Si, Ti, Al, Ta, N, O, and C. The thicknesses of the first and second barrier layers 350, 370 are preferably thin, for example being less than or equal to about 30 nm, more preferably being between about 2 nm and 10 nm. In the illustrated embodiment the second barrier layer 370 has a width substantially equal to that of the thermal protect layer 360. In some alternative embodiments the second barrier layer 370 has a width less than that of the thermal protect layer 360, for example being substantially equal to the width of the phase change kernel 320.

A phase change kernel 320 and top electrode 330 form a multi-layer stack, the phase change kernel 320 comprising phase change material. The top electrode 330 can comprise, for example, TiN, TaN, TiW, TiSiN, or TaSiN. As can be seen in FIG. 3A, the width 324 of the multi-layer stack is less than that thermal protect layer 360 in a first direction in the plane of the cross-section illustrated. Also, the width of the stack in a second direction into and out of the cross-section illustrated in the Figure is less than that of the thermal protect layer 360.

In operation, voltages on the bottom electrode 310 and the top electrode 330 can induce current to flow from the bottom electrode 310 to the top electrode 330, or vice-versa, via the thermal protect structure 340 and phase change kernel 320.

The active region is the region of the phase change kernel 320 in which the memory material is induced to change between at least two solid phases. The active region can be made extremely small in the illustrated structure, reducing the magnitude of current needed to induce phase changes. In preferred embodiments the width 324 (which in some embodiments is a diameter) of the kernel 320 is less than a minimum feature size for a lithographic process used to form the memory cell. In some embodiments the width 324 of the kernel 320 is less than or equal to 60 nm, for example between about 10 nm and 40 nm. The thickness 322 of the kernel 320 can also be less than the minimum feature size for a lithographic process used to form the memory cell. The thickness 322 can be established by a thin film deposition technique of memory material on the thermal protect structure 340. In some embodiments the thickness 322 is less than or equal to 100 nm, for example being between about 20 nm and 80 nm.

The thermal protect structure 340 acts as a heat insulator to reduce the amount of heat drawn away from the phase change kernel 320 by the bottom electrode 310, effectively increasing the amount of heat generated within the phase change kernel 320 per unit value of current. The thermal isolation of the kernel 320 allows for memory cell designs having lower currents than those permitted by the prior art, which in turn allows for reducing the size of the memory cell itself. The electrically conductive thermal protect layer 360 comprises thermal protect material having a thermal conductivity less than that of the material of the bottom electrode 310. The thermal conductivity of the thermal protect layer 360 is preferably at most 10%, and more preferably at most 0.1% of the thermal conductivity of the material of the bottom electrode 310.

In some embodiments the thermal protect layer 360 comprises a phase change based memory material, for example comprising the elements Ge, Sb, and Te. The thermal protect layer 360 may comprise, for example, the same material as the phase change kernel 320. Alternatively, the thermal protect layer 360 may comprise a compound having a different ratio of elements than that of the material of the phase change kernel 320, for example the phase change kernel 320 comprising $Ge_2Sb_2Te_5$ and the thermal protect layer 360 comprising the elements Ge, Sb, and Te in another ratio or comprising only the elements Ge and Sb. An advantage of using the same material for the phase change kernel 320 and the thermal protect layer 360 is that the diffusion effect between the phase change kernel 320 and the thermal protect layer 360 will be less of a concern. The thermal protect layer 360 may comprise a chalcogenide or other phase change material doped with impurities in some embodiments to modify conductivity, transition temperature, melting temperature, and other properties. Representative impurities used for doping chalcogenides include nitrogen, silicon oxygen, silicon dioxide, silicon nitride, copper, silver, gold, aluminum, aluminum oxide, tantalum, tantalum oxide, tantalum oxide, tantalum nitride, titanium and titanium oxide. The thickness of the thermal protect layer 360 can be, for example, less than or equal to about 100 nm, more preferably being between about 20 nm and 80 nm.

Embodiments of the memory cell include phase change based memory materials, including chalcogenide based materials and other materials, for the phase change kernel 320. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon oxygen, silicon dioxide, silicon nitride, copper, silver, gold, aluminum, aluminum oxide, tantalum, tantalum oxide, tantalum oxide, tantalum nitride, titanium and titanium oxide. See, for example U.S. Pat. No. 6,800,504, and U.S. Patent Application Publication No. US 2005/0029502.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined empirically or by modeling, and specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Representative chalcogenide material can be characterized as follows: $Ge_xSb_yTe_z$ where x:y:z=2:2:5. Other compositions can be used with x: 0~5; y: 0~5; z: 0~10. GeSbTe with doping, such as N—, Si—, Ti—, or other element doping may also be used. These materials can be formed by PVD sputtering or magnetron-sputtering method with reactive gases of Ar, $N_2$, and/or He, etc and chalcogenide at the pressure of 1 mtorr~100 mtorr. The deposition is usually done at room temperature. A collimator with aspect ratio of 1~5 can be used to improve the fill-in performance. To improve the fill-in performance, the DC bias of several tens to several hundreds of volt is also used. Also, the combination of DC bias and the collimator can be used simultaneously. The post deposition annealing treatment with vacuum or N2 ambient is sometimes needed to improve the crystallize state of chalcogenide material. The annealing temperature typically ranges 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

Figure 3D:
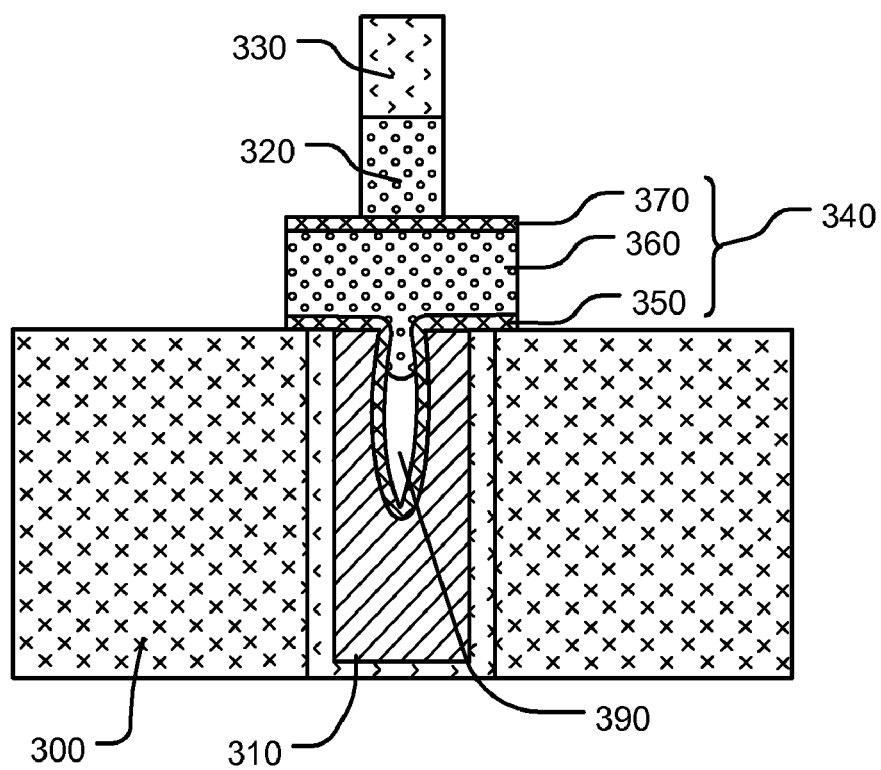
FIG. 3D illustrates a cross-sectional view of the memory cell illustrated in FIG. 3A further including a seam in the bottom electrode.
Figure 3E:
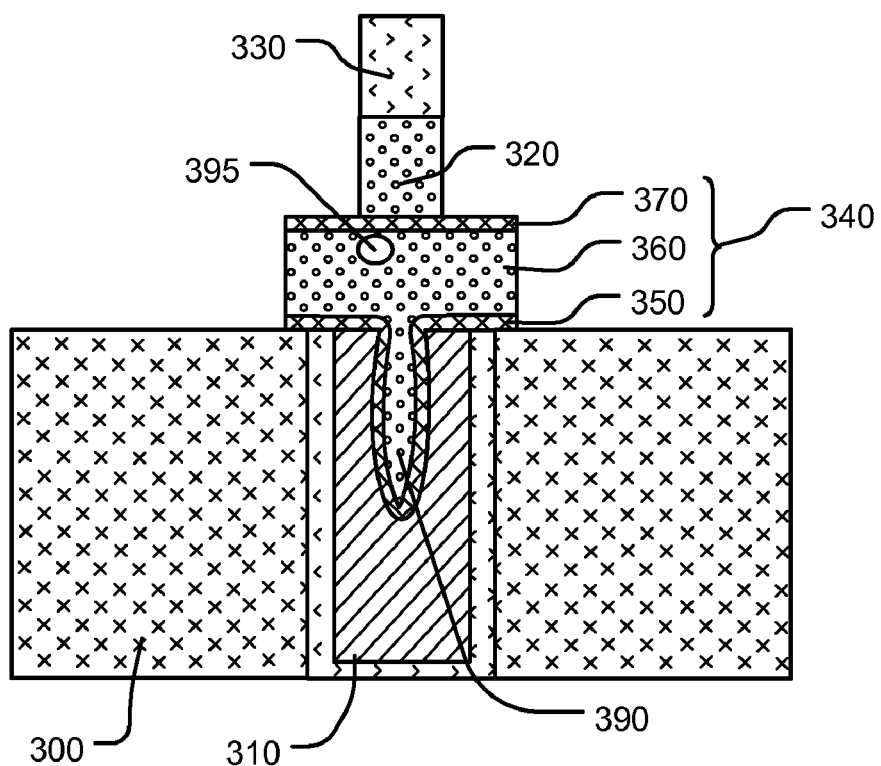
FIG. 3E illustrates a cross-sectional view of the memory cell illustrated in FIG. 3B further including the seam filled to create a void.

An important aspect of the present invention is that the thermal protect structure 340 can improve the reliability and stability of a memory cell in which a seam 390 exists in the bottom electrode 310, as illustrated in FIG. 3D. The thermal protect structure 340 can partially fill in the seam 390 and thus can improve the memory cell stability and reliability. As illustrated in FIG. 3E, even if the memory cell manufacturing process or operation causes material from the thermal protect layer 360 to flow into the seam 390 and create a void 395 in the thermal protect layer 360, the second barrier layer 370 can support the phase change kernel 320 and create a stable and reliable contact between the thermal protect structure 340 and the phase change kernel 320.

The first and second barrier layers 350, 370 are optional and one or both layers may be omitted in some embodiments. Omitting one or both of the first and second barrier layers 350, 370 may improve the heat insulation properties of the thermal protect structure 340.

Figure 4A:
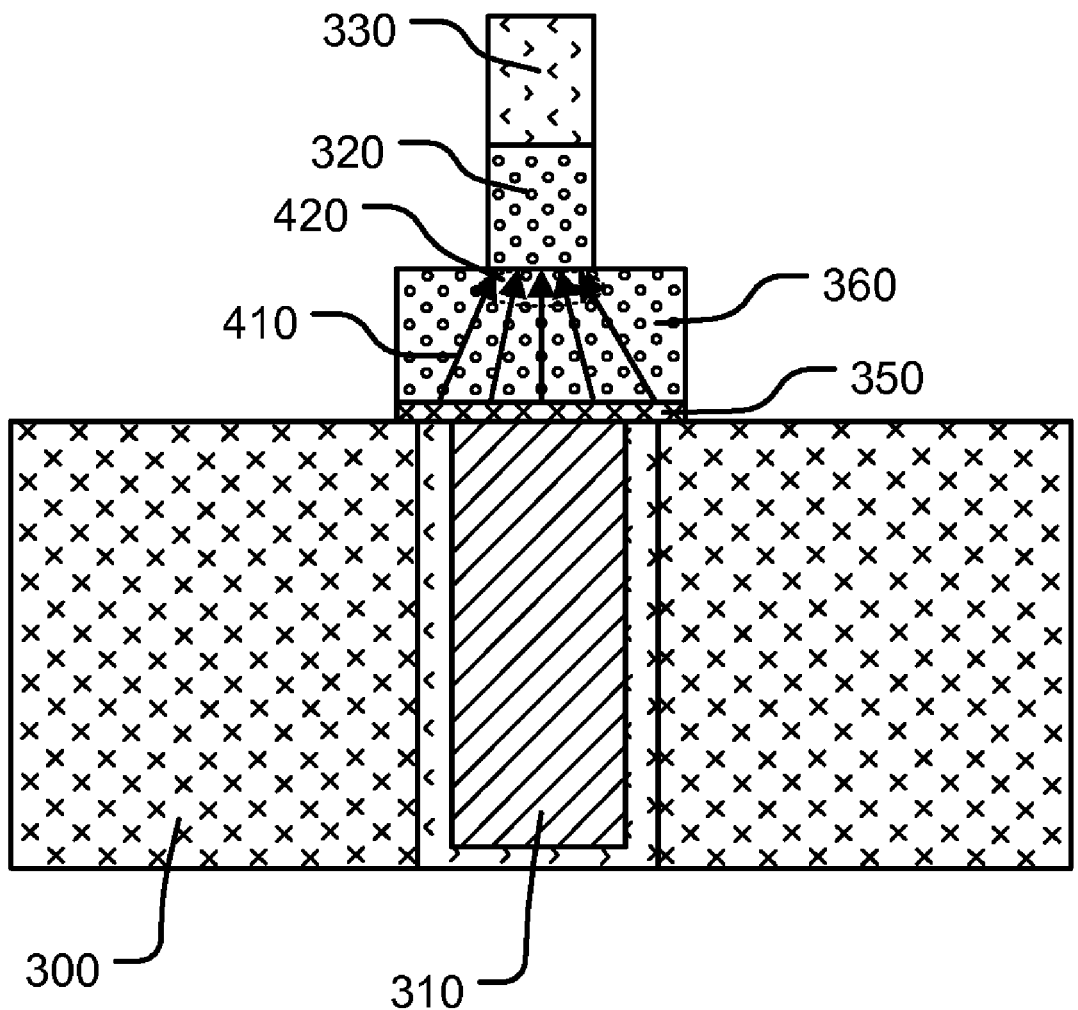
FIG. 4A illustrates a cross-sectional view of a memory cell similar to that of FIG. 3A with the second barrier layer omitted.

FIG. 4A shows an embodiment similar to that shown in FIG. 3A with the second barrier layer 370 omitted, resulting in a non-uniform electric field/current density 410 in the thermal protect layer 360. The non-uniform electric field/current density 410 will increase the electrical resistance of the thermal protect layer 360 and thus increase the voltage difference between the first barrier layer 350 and the phase change kernel 320 for a given current. The non-uniform electric field/current density 410 will result in a hot spot 420 having a relatively higher electric field/current density.

Figure 4B:
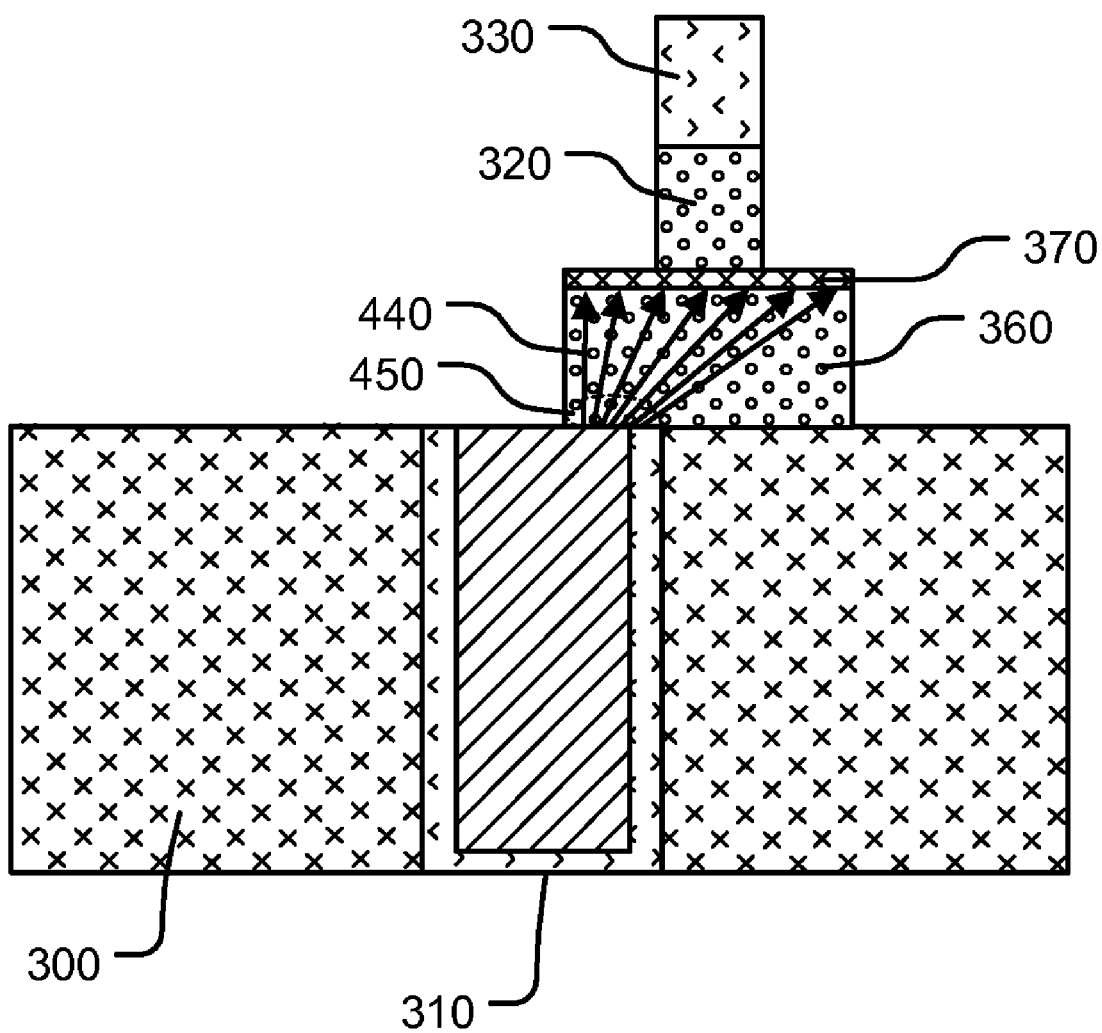
FIG. 4B illustrates a cross-sectional view of a memory cell similar to that of FIG. 4A with the first barrier layer omitted.

FIG. 4B shows an embodiment similar to that shown in FIG. 3A with the first barrier layer 350 omitted and a misalignment of the thermal protect layer 360 to the bottom electrode 310, resulting in a non-uniform electric field/current density 440 and hot spot 450 in the thermal protect layer 360.

Figure 5A:
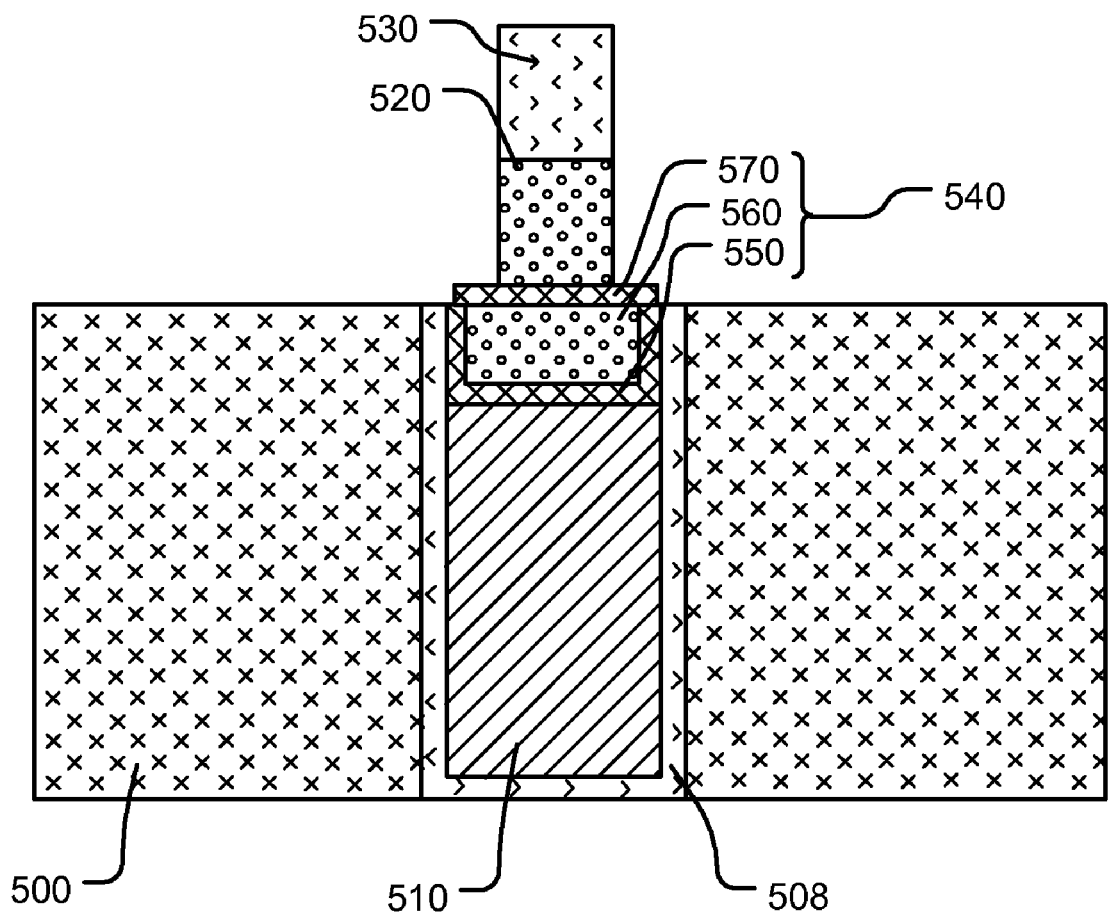
FIG. 5A illustrates a cross-sectional view of a memory cell having a thermal protect structure in accordance with an embodiment.

FIG. 5A illustrates a cross-sectional view of a memory cell having a thermal protect structure 540 between a top electrode 530 and a bottom electrode 510 in accordance with an embodiment. The thermal protect structure 540 comprises a first barrier layer 550 and a thermal protect layer 560 formed within a recess in the dielectric 500, and a second barrier layer 570 on the thermal protect layer 560. The materials and dimensions of the memory cell illustrated in FIG. 5A can be the same as those of the embodiment illustrated in FIG. 3A.

The thermal protect structure 540 is on a bottom electrode 510 extending through a dielectric 500 to underlying access circuitry not shown. An optional layer 508 separates the bottom electrode 510 from the dielectric 500 and the access circuitry (not shown). The layer 508 can provide a diffusion barrier between the bottom electrode 510 and the dielectric layer 500 depending upon the materials chosen.

A phase change kernel 520 comprising phase change material is on the thermal protect structure 540 and a top electrode 530 is on the phase change kernel 520.

Figure 5B:
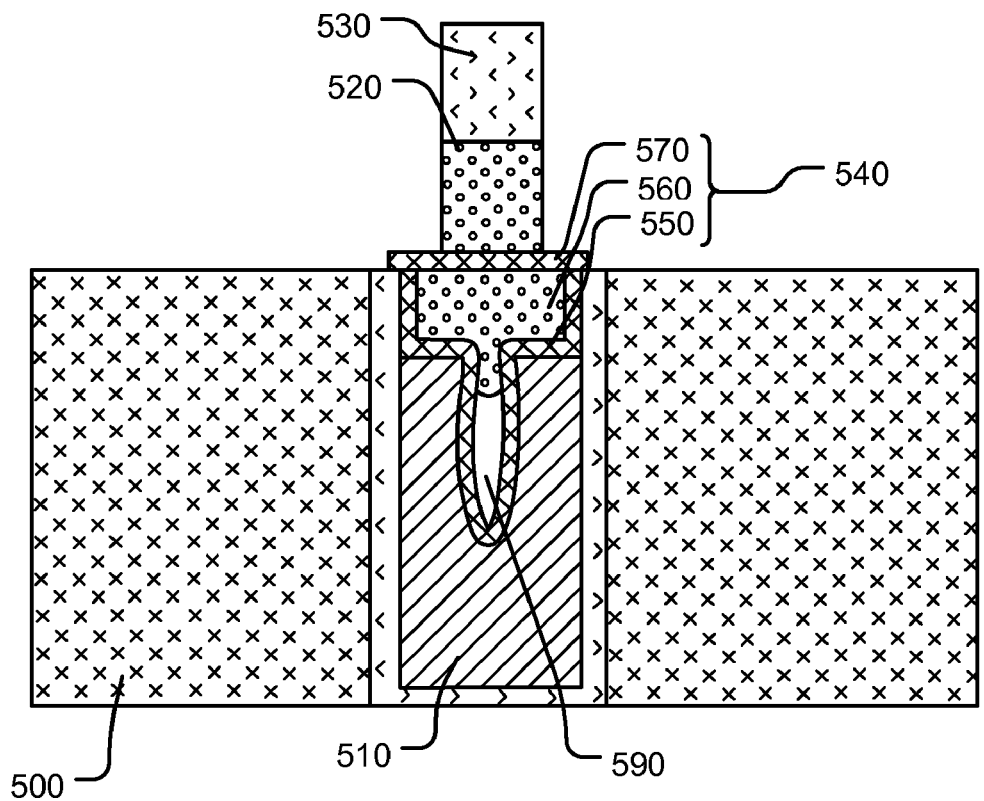
FIG. 5B illustrates a cross-sectional view of the memory cell illustrated in FIG. 5A further including a seam in the bottom electrode.
Figure 5C:
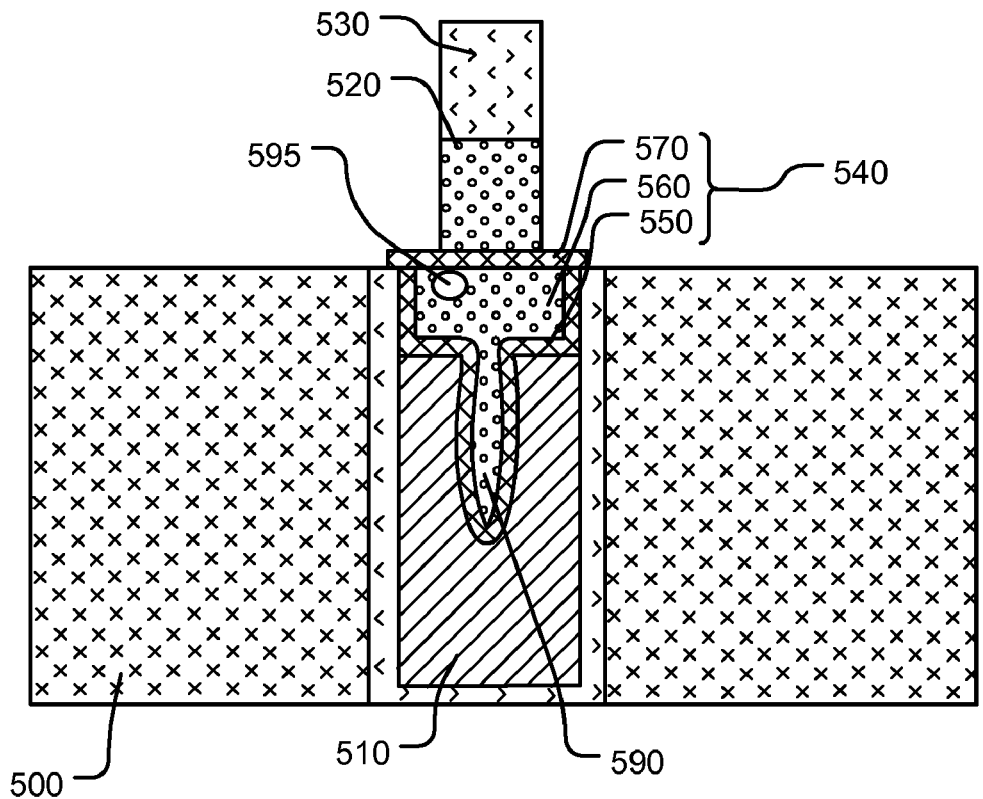
FIG. 5C illustrates a cross-sectional view of the memory cell illustrated in FIG. 5B further including the seam filled to create a void.

An important aspect of the present invention is that the thermal protect structure 540 can improve the reliability and stability of a memory cell in which a seam 590 exists in the bottom electrode 510, as illustrated in FIG. 5B. The thermal protect structure 540 can partially fill in the seam 590 and thus can improve the memory cell stability and reliability. As illustrated in FIG. 5C, even if the memory cell manufacturing process or operation causes material from the thermal protect layer 560 to flow into the seam 590 and create a void 595 in the thermal protect layer 560, the second barrier layer 570 can support the phase change kernel 520 and create a stable and reliable contact between the thermal protect structure 540 and the phase change kernel 520.

FIGS. 6-12 illustrate an embodiment of a process flow for manufacturing a memory cell in accordance with a first embodiment. The following description does not repeat certain explanations regarding materials, thicknesses, and the like, as set out above.

Figure 6:
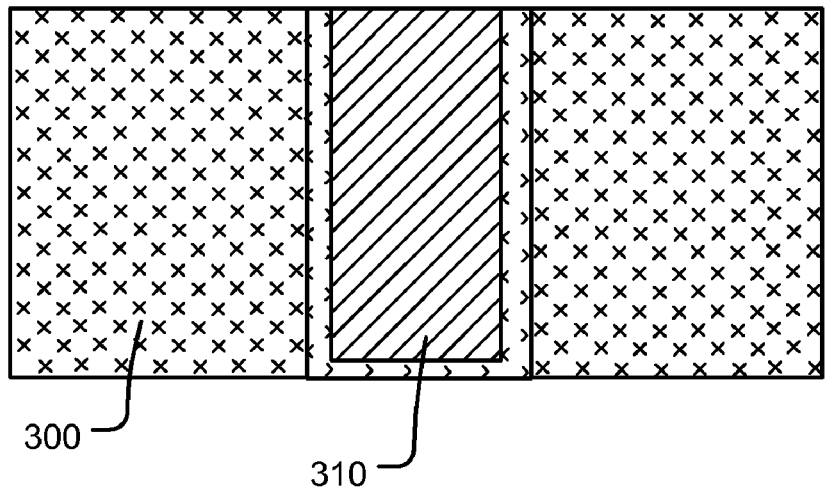
FIGS. 6 through 12 illustrate a fabrication sequence for manufacturing a memory cell in accordance with a first embodiment.

FIG. 6 illustrates a cross-sectional view of a first step in a process flow comprising providing an inter-layer dielectric 300 having a bottom electrode (contact) 310 extending therethrough.

Figure 7:
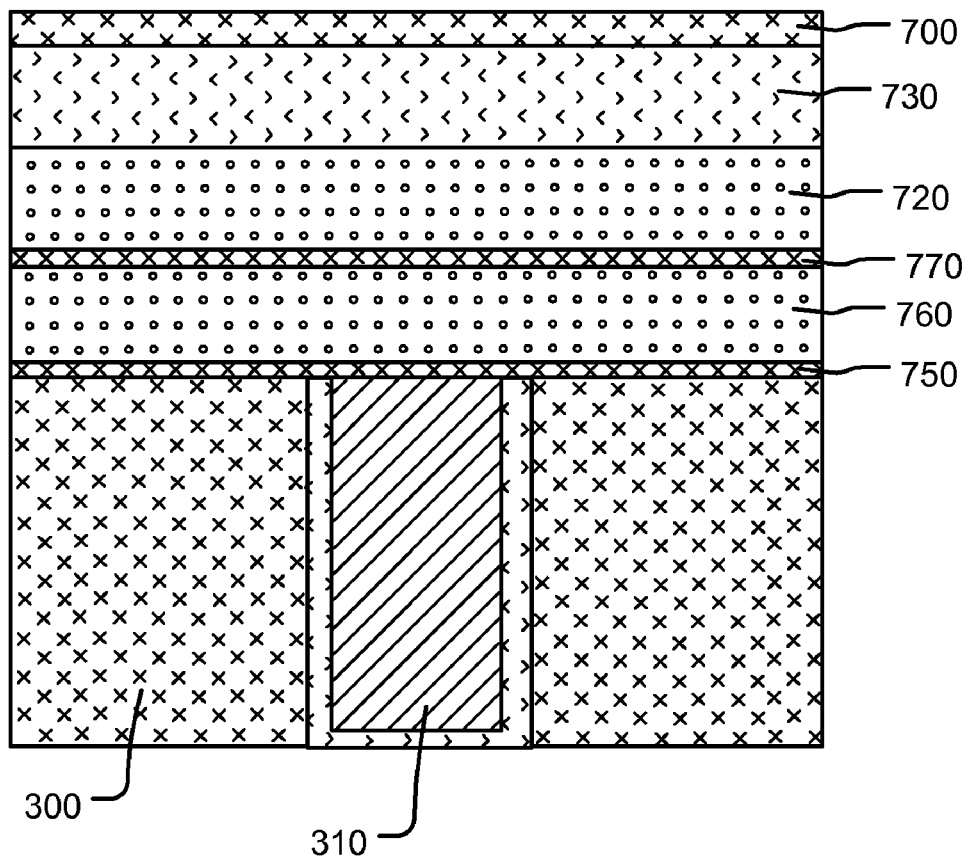

Next, a multi-layer structure is formed on the structure illustrated in FIG. 6 comprising sequentially forming a layer of first barrier material 750, a layer of thermal protect material 760, a layer of second barrier material 770, a layer of phase change material 720, a layer of top electrode material 730, and a layer of hard mask material 700, resulting in the structure illustrated in FIG. 7. The hard mask material 700 in some embodiments comprises SiN, SiO$_2$, or SiON.

Figure 8:
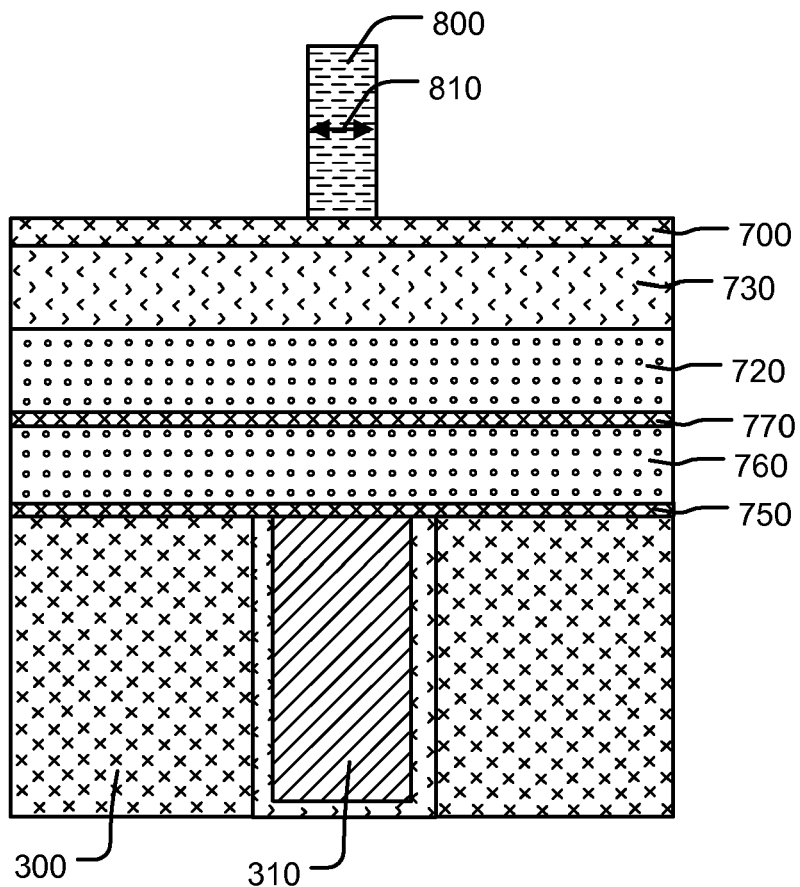

Next, a pillar 800 comprising photoresist material is formed on the structure illustrated in FIG. 7, resulting in the structure illustrated in FIG. 8. The pillar 800 can be formed, for example, by patterning a layer of photoresist. Additionally, trimming is preferably then performed on the patterned photoresist, using for example an anisotropic etching procedure such as oxygen plasma etching, so that the pillar 800 has a width 810 (which in some embodiments is a diameter) which is less than a minimum feature size of the process used to pattern the layer of photoresist.

Figure 9:
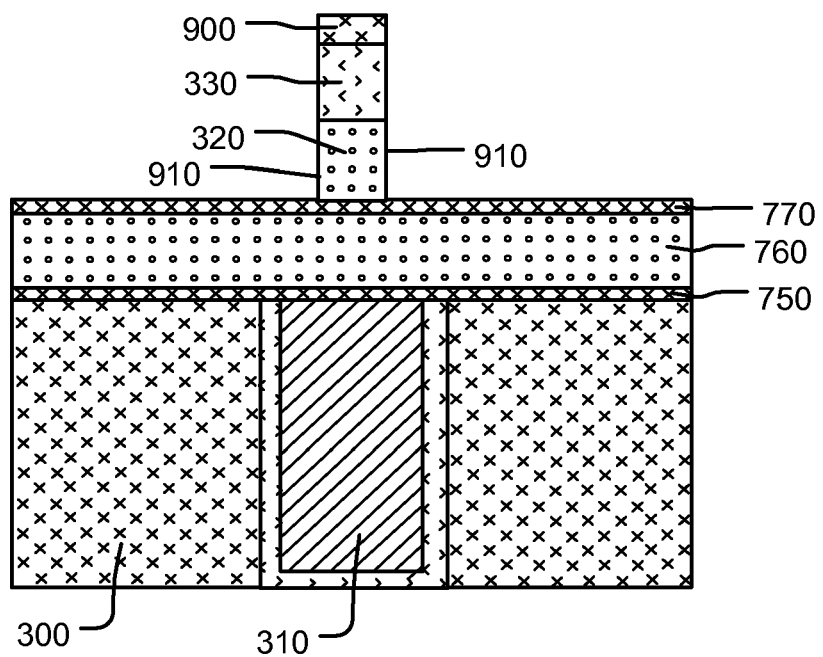

Next, etching down to the layer of second barrier material 770 is performed on the structure illustrated in FIG. 8 using the pillar 800 as a mask and the pillar 800 is then removed, resulting in the structure illustrated in FIG. 9 having a hard mask cap 900, a top electrode 330, and a phase change kernel 320 having a sidewall 910. The layer of second barrier material 770 can act as an etch stop layer for the etching process. Alternatively, the layer of second barrier material 770 can also be etched, resulting in a second barrier layer comprising second barrier material 770 having a width substantially equal to that of the phase change kernel 320.

Figure 10:
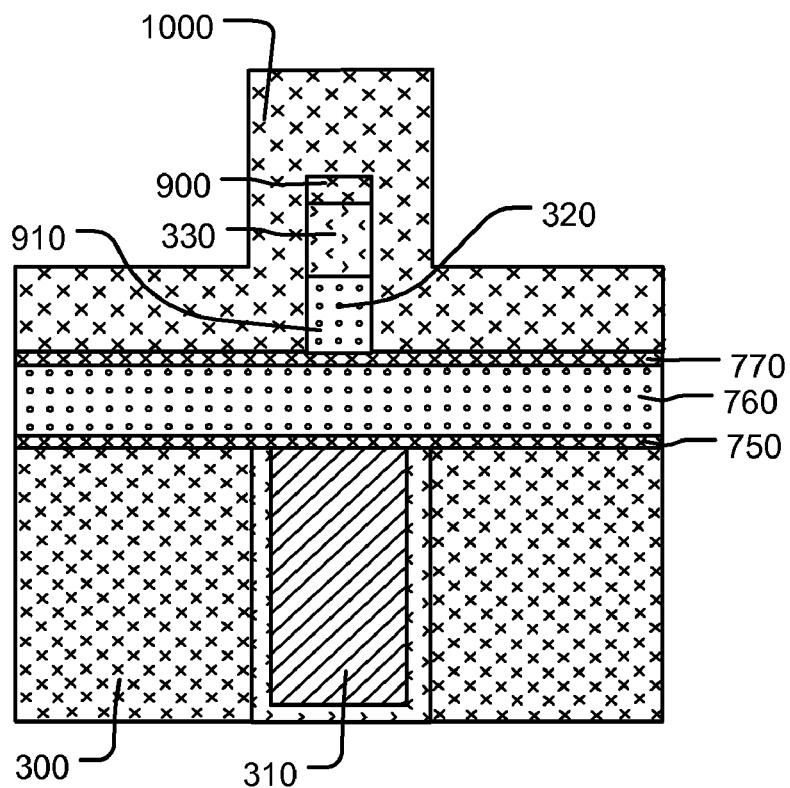

Next, a layer of dielectric material 1000 is formed on the structure illustrated in FIG. 9, resulting in the structure illustrated FIG. 10. The dielectric material 1000 can comprise, for example, SiO$_2$, SiN, SiON, or AlO. The layer of dielectric material 1000 is then etched to form dielectric spacer 1100 on the sidewall 910 of the phase change kernel 320, as illustrated in FIG. 11.

Figure 11:
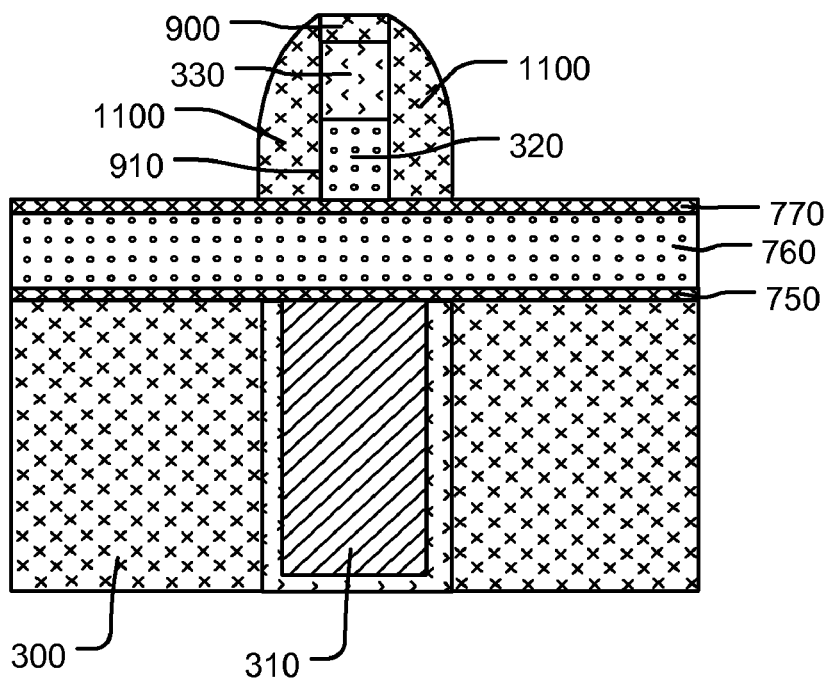
Figure 12:
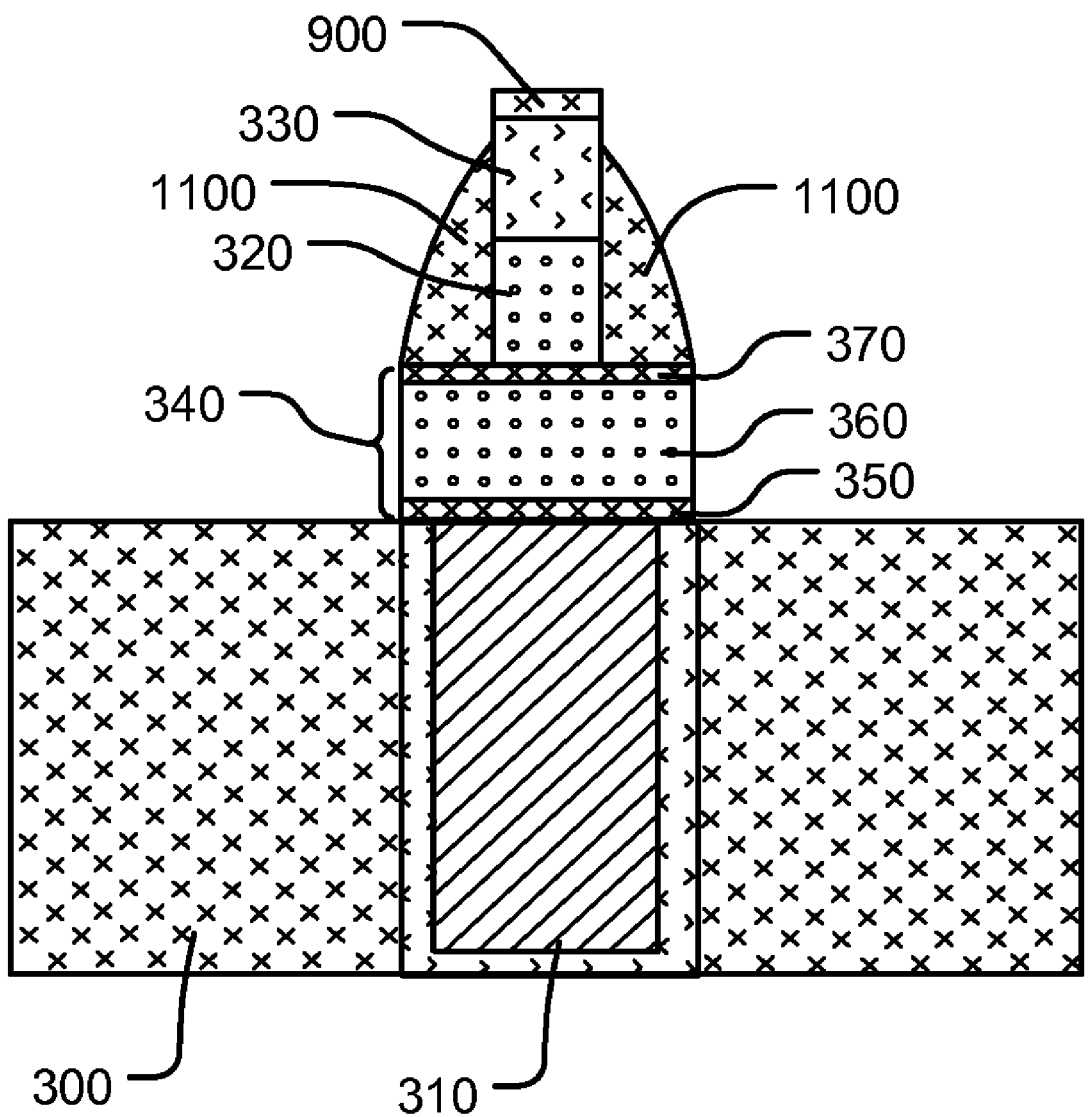

Next, etching down to the dielectric 300 is performed on the structure illustrated in FIG. 11 using the hard mask cap 900 and dielectric spacer 1100 as a mask, resulting in the self-aligned memory cell illustrated in FIG. 12 having a thermal protect structure 340 aligned with the phase change kernel 320, the top electrode 330, and the dielectric spacer 1100. The thermal protect structure 340 comprises a first barrier layer 350, a thermal protect layer 360, and a second barrier layer 370.

Advantages of using the process illustrated in FIGS. 6-12 include a resulting self-aligned memory cell and that only a single photoresist mask is needed.

FIGS. 13-20 illustrate an embodiment of a process flow for manufacturing a memory cell in accordance with a second embodiment.

Figure 13:
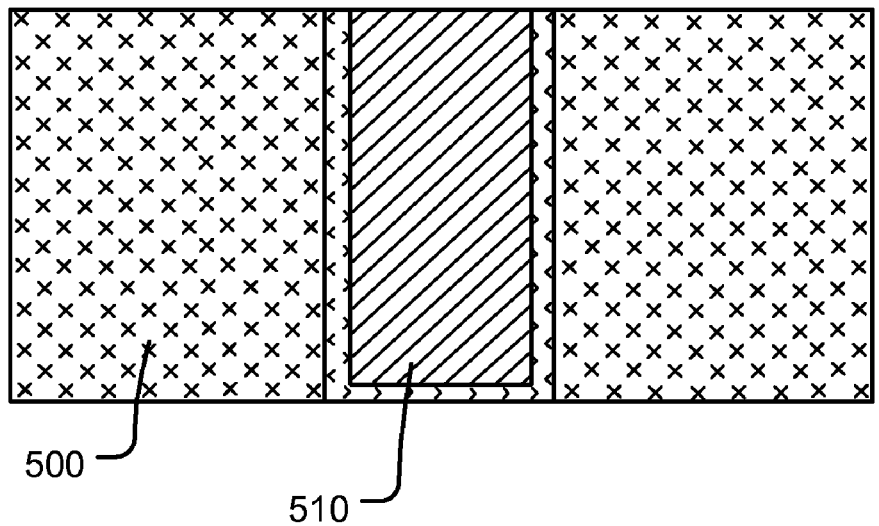
FIGS. 13 through 20 illustrate a fabrication sequence for manufacturing a memory cell in accordance with a second embodiment.

FIG. 13 illustrates a cross-sectional view of a process flow comprising providing an inter-layer dielectric 500 having a bottom electrode 510 extending therethrough.

Figure 14:
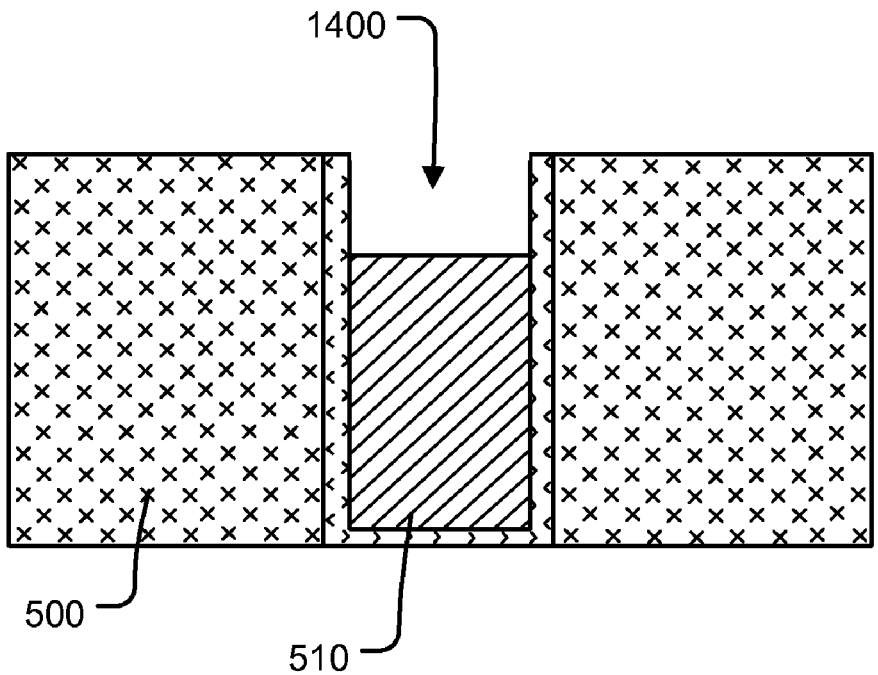

Next, a portion of the bottom electrode 510 illustrated in FIG. 13 is etched to form a recess 1400, resulting in the structure illustrated in FIG. 14.

Figure 15:
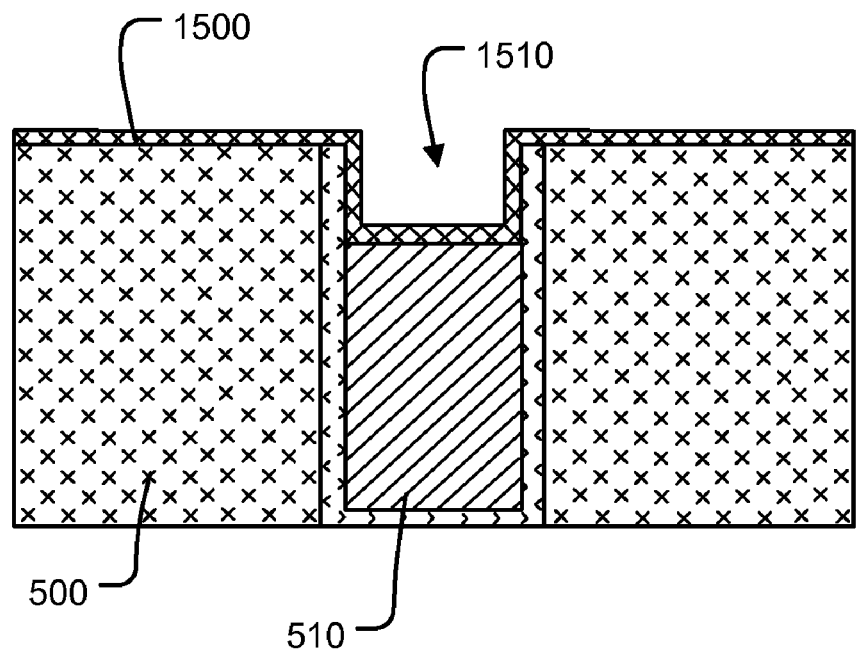

Next, a conformal layer a first barrier material 1500 is formed on the structure illustrated in FIG. 14, resulting in the structure illustrated in FIG. 15. The first barrier material 1500 within the recess defines an opening 1510 within the recess 1400.

A layer of thermal protect material is formed on the structure illustrated in FIG. 15 and then a planarizing process such as Chemical Mechanical Polishing CMP is performed, resulting in the structure illustrated in FIG. 15 having a first barrier layer 550 and a thermal protect layer 560 formed within the recess 1400.

Figure 16:
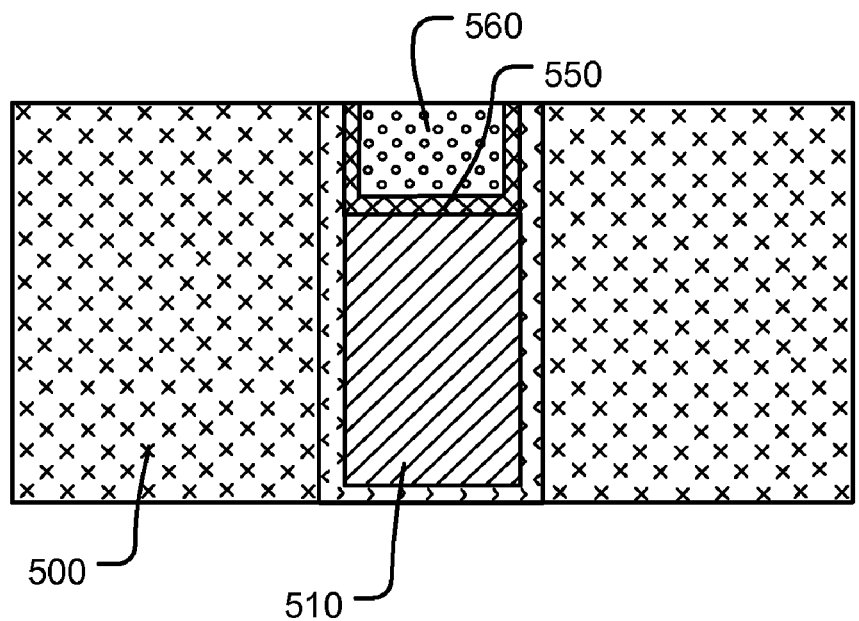

Next, a multi-layer structure is formed on the structure illustrated in FIG. 16 comprising sequentially forming a layer of second barrier material 1770, a layer of phase change material 1720, and a layer of top electrode material 1730. In some embodiments the multi-layer structure further comprises a layer of hard mask material on the top electrode material 1730.

Figure 17:
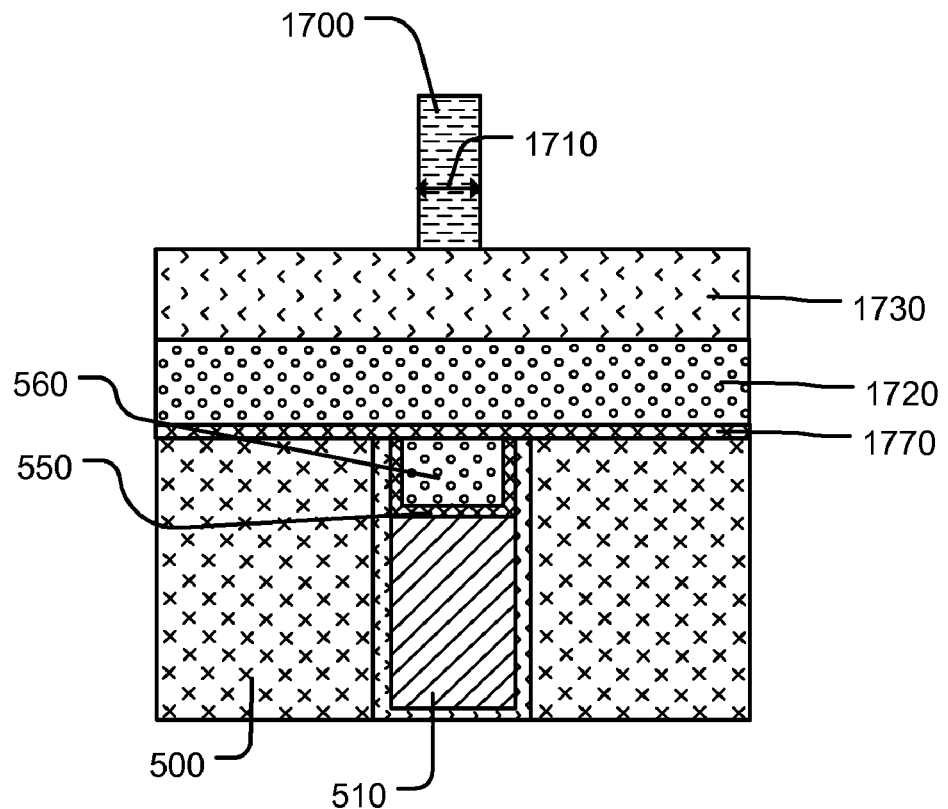

Next, a pillar 1700 comprising photoresist material is formed on the multi-layer structure, resulting in the structure illustrated in FIG. 17. The pillar 1700 can be formed, for example, by patterning a layer of photoresist. Additionally, trimming is preferably performed on the patterned photoresist, using for example an anisotropic etching procedure such as oxygen plasma etching, so that the pillar 1700 has a width 1710 (which in some embodiments is a diameter) which is less than a minimum feature size of the process used to pattern the layer of photoresist.

Figure 18:
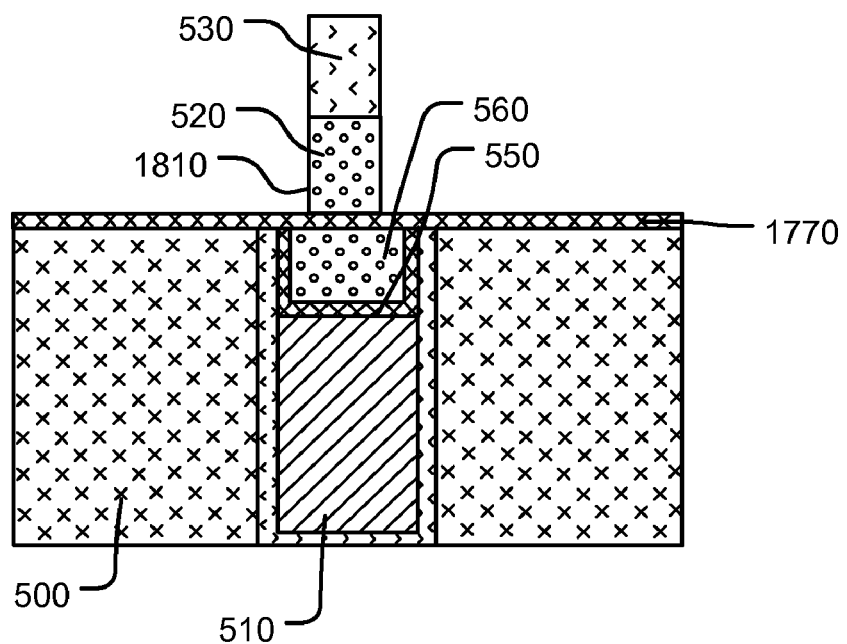

Next, etching down to the layer of second barrier material 1770 is performed on the structure illustrated in FIG. 17 using the pillar 1700 as a mask and the pillar 1700 is then removed, resulting in the structure illustrated in FIG. 18 having a top electrode 530 and a phase change kernel 520 having a sidewall 1810. The layer second barrier material 1700 can act as an etch stop layer for the etching process. Alternatively, the layer of second barrier material 1700 can also be etched, resulting in a second barrier layer comprising second barrier material 1700 having a width substantially equal to that of the phase change kernel 520

Figure 19:
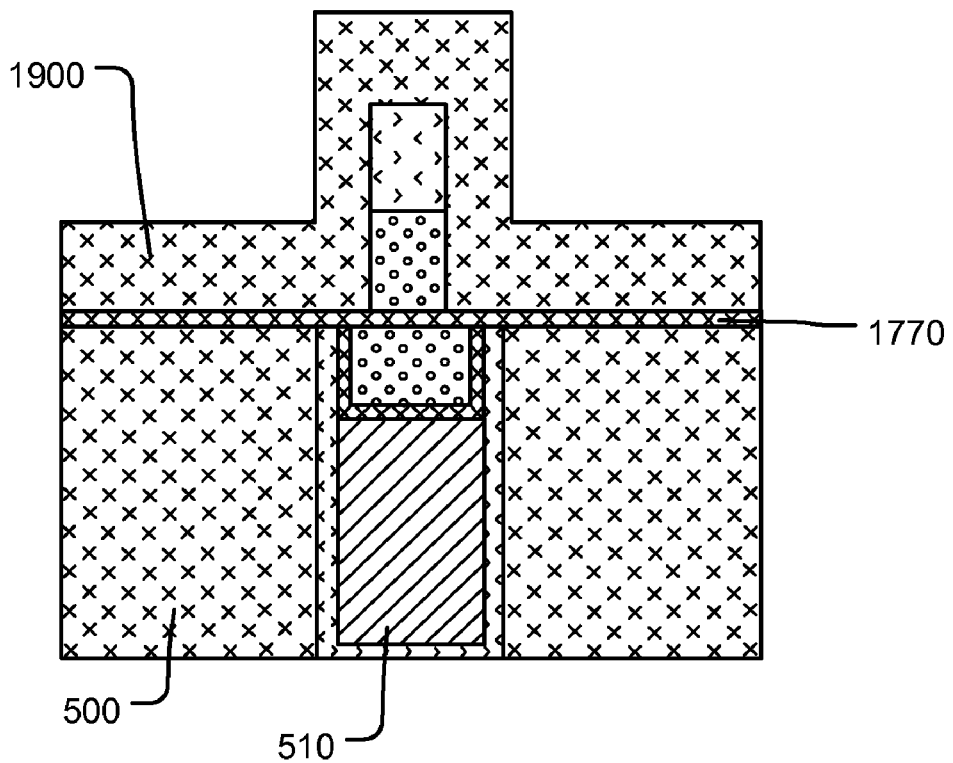

Next, a layer of dielectric material 1900 is formed on the structure illustrated in FIG. 18, resulting in the structure illustrated in FIG. 19.

Figure 20:
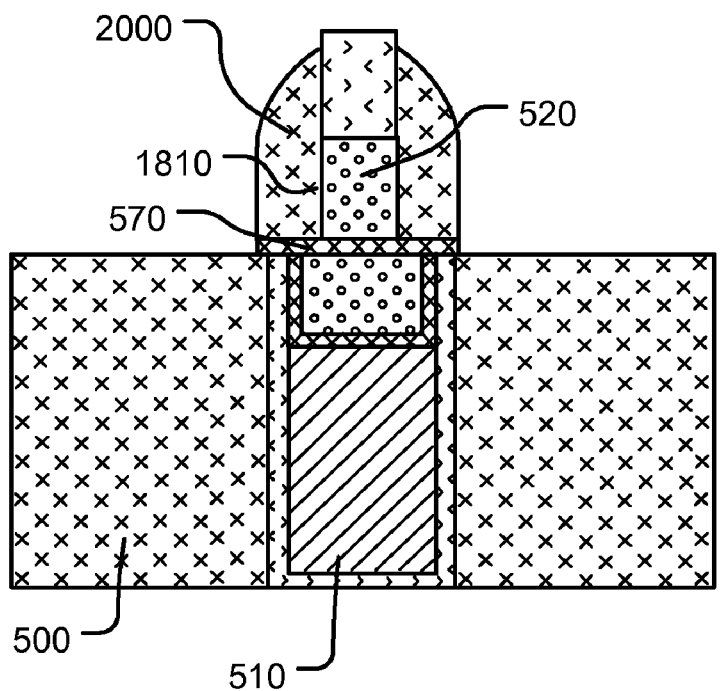

Next, etching is performed down to the dielectric 500 to form dielectric spacer 2000 on the sidewall 1810 of the phase change kernel 520 and to form second barrier layer 570 comprising second barrier material 1770, resulting in the memory cell illustrated in FIG. 20.

Advantages of an embodiment described herein include memory cells having reduced cell sizes, as well as a structure that addresses the heat conductivity problem, providing an array architecture supporting high-density devices, and a method for manufacturing such structure that meets tight process variation specifications needed for large-scale memory devices. Furthermore, the thermal protect structure provides a good contact surface for the phase change kernel regardless of irregularities of the underlying layers.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are incorporated by reference.

What is claimed is:

1. A memory device comprising:
a bottom electrode comprising bottom electrode material;
a thermal protect structure on the bottom electrode, the thermal protect structure comprising a layer of thermal protect material and a first barrier layer on the thermal protect material, the thermal protect material having a thermal conductivity less than that of the bottom electrode material, and the thermal protect material having an electrical conductivity less than that of the first barrier layer; and
a multi-layer stack on and self-aligned with the first barrier layer of the thermal protect structure, the multi-layer stack comprising a top electrode on a phase change kernel, the phase change kernel comprising phase change material having at least two solid phases, wherein the multi-layer stack has a first width in a first direction less than that of the layer of thermal protect material and a second width in a second direction less than that of the layer of thermal protect material, the second direction perpendicular to the first direction.

2. The device of claim 1, wherein the thermal protect structure comprises:
a second barrier layer comprising a barrier material on the bottom electrode; and
the layer of thermal protect material on the barrier layer.

3. The device of claim 1, wherein the thermal protect structure comprises:
a second barrier layer on the bottom electrode;
the layer of thermal protect material on the first second barrier layer; and
the first barrier layer on the layer of thermal protect material, wherein the first and second barrier layers have an electrical conductivity greater than that of the thermal protect material.

4. The device of claim 1, wherein:
the bottom electrode extends to a top surface of a dielectric layer; and
the thermal protect structure comprises:
a second barrier layer on the top surface of the dielectric layer and contacting the bottom electrode;
the layer of thermal protect material on the second barrier layer; and
the first barrier layer on the layer of thermal protect material, wherein the first and second barrier layers have an electrical conductivity greater than that of the thermal protect material.

5. The device of claim 1, wherein:
the bottom electrode extends to below a top surface of a dielectric layer to define a recess; and
the thermal protect structure comprises:
a second barrier layer within the recess and contacting the bottom electrode to define an opening within the recess;
the layer of thermal protect material on the second barrier layer and filling the opening within the recess; and
the first barrier layer on the layer of thermal protect material, wherein the first and second barrier layers have an electrical conductivity greater than that of the thermal protect material.

6. A method for manufacturing a memory device, the method comprising:
forming a bottom electrode comprising bottom electrode material;
forming a thermal protect structure on the bottom electrode, the thermal protect structure comprising a layer of thermal protect material and a first barrier layer on the thermal protect material, the thermal protect material having a thermal conductivity less than that of the bottom electrode material, and the thermal protect material having an electrical conductivity less than that of the first barrier layer; and
forming a multi-layer stack on and self-aligned with the first barrier layer of the thermal protect structure, the multi-layer stack comprising a top electrode on a phase change kernel, the phase change kernel comprising phase change material having at least two solid phases, wherein the multi-layer stack has a first width in a first direction less that of the layer of thermal protect material and a second width in a second direction less than that of the layer of thermal protect material, the second direction perpendicular to the first direction.

7. The method of claim 6, wherein the forming a thermal protect structure comprises:
forming a second barrier layer comprising a barrier material on the bottom electrode; and
forming the layer of thermal protect material on the second barrier layer.

8. The method of claim 6, wherein the forming a thermal protect structure comprises:
forming a second barrier layer on the bottom electrode;
forming the layer of thermal protect material on the second barrier layer; and
forming the first barrier layer on the layer of thermal protect material, wherein the first and second barrier layers have an electrical conductivity greater than that of the thermal protect material.

9. The method of claim 6, wherein:
the forming the bottom electrode step comprises forming the bottom electrode extending to a top surface of a dielectric layer; and
the forming the thermal protect structure step comprises:
forming a second barrier layer on the top surface of the dielectric layer and contacting the bottom electrode;
forming the layer of thermal protect material on the second barrier layer; and
forming the first barrier layer on the layer of thermal protect material, wherein the first and second barrier layers have an electrical conductivity greater than that of the thermal protect material.

10. The method of claim 6, wherein:
the forming the bottom electrode step comprises forming the bottom electrode extending to a top surface of a dielectric layer, and etching a portion of the bottom electrode to form a recess; and
the forming the thermal protect structure comprises:
forming a conformal second barrier layer within the recess and contacting the bottom electrode to define an opening within the recess;
forming the layer of thermal protect material on the second barrier layer and filling the opening within the recess; and
forming the first barrier layer on the layer of thermal protect material, wherein the first and second barrier materials have an electrical conductivity greater than that of the thermal protect material.

11. A method for manufacturing a memory device, the method comprising:
providing a bottom electrode extending to a top surface of a first dielectric layer;
sequentially forming a layer of first barrier material, a layer of thermal protect material, a layer of second barrier material, a layer of phase change material, a layer of top electrode material and a layer of hard mask material over the first dielectric layer, such that the layer of first barrier material is on the bottom electrode;
forming a pillar of photoresist on the hard mask material and overlying the bottom electrode;
etching down through the layer of phase change material using the pillar as a mask to form a multi-layer stack, the multi-layer stack comprising (a) a phase change kernel comprising phase change material, the phase change kernel having a sidewall, (b) a top electrode comprising top electrode material on the phase change kernel, and (c) a hard mask cap comprising hard mask material on the top electrode;
forming a layer of a second dielectric material on the multi-layer stack;
etching the layer of second dielectric material to form a dielectric spacer on the sidewall of the phase change kernel; and
etching down to the first dielectric layer using the dielectric spacer and the hard mask cap as a mask to form a thermal protect structure, the thermal protect structure comprising (a) a first barrier layer comprising first barrier material on the bottom electrode, (b) a thermal protect layer comprising thermal protect material on the first barrier layer, and (c) a second barrier layer comprising second barrier material on the thermal protect layer;
wherein the thermal protect material has a thermal conductivity less than that of material of the bottom electrode and has an electrical conductivity less than that of the first and second barrier layer materials, and the memory material has at least two solid phases.

12. A method for manufacturing a memory device, the method comprising:
providing a bottom electrode extending to a top surface of a first dielectric layer;
etching a portion of the bottom electrode to form a recess;
forming a conformal layer of first barrier material on the top surface of the first dielectric layer and within the recess to contact the bottom electrode to define an opening within the recess;
forming a layer of thermal protect material on the first barrier material and filling the opening within the recess;
planarizing the layer of first barrier material and the layer of thermal protect material to expose the top surface of the first dielectric layer, thereby forming a first barrier layer comprising first barrier material on the bottom electrode and within the recess, and forming a thermal protect layer comprising thermal protect material on the first barrier layer and within the recess;
sequentially forming a layer of second barrier material, a layer of phase change material, and a layer of top electrode material over the first dielectric layer, such that the layer of second barrier material is on the thermal protect layer;
forming a pillar of photoresist on the layer of top electrode material and overlying the bottom electrode;
etching down through the layer of phase change material using the pillar as a mask to form a multi-layer stack, the multi-layer stack comprising a phase change kernel comprising phase change material and a top electrode comprising top electrode material on the phase change kernel, the phase change kernel having a sidewall;
forming a layer of second dielectric material on the multi-layer stack; and
etching the layer of second dielectric material and the layer of second barrier material, thereby forming a second barrier layer comprising second barrier material on the thermal protect layer, and forming a dielectric spacer comprising second dielectric material on the sidewall of the phase change kernel;
wherein the thermal protect material has a thermal conductivity less than that of material of the bottom electrode and has an electrical conductivity less than that of the first and second barrier layer materials, and the memory material has at least two solid phases.

* * * * *